United States Patent
Hara et al.

(10) Patent No.: US 6,770,137 B2
(45) Date of Patent: Aug. 3, 2004

(54) MANUFACTURING METHOD FOR PRODUCING SILICON CARBIDE CRYSTAL USING SOURCE GASES AND APPARATUS FOR THE SAME

(75) Inventors: Kazukuni Hara, Kasugai (JP); Masao Nagakubo, Nishikamo-gun (JP); Shoichi Onda, Toyokawa (JP)

(73) Assignee: Denso Corporation, Kariya (JP)

( * ) Notice: Subject to any disclaimer, the term of this patent is extended or adjusted under 35 U.S.C. 154(b) by 61 days.

(21) Appl. No.: 09/985,354

(22) Filed: Nov. 2, 2001

(65) Prior Publication Data

US 2002/0056412 A1 May 16, 2002

(30) Foreign Application Priority Data

Nov. 10, 2000 (JP) ........................................ 2000-343663

(51) Int. Cl.[7] ............................................... C30B 23/06
(52) U.S. Cl. ...................... 117/201; 117/702; 117/951; 117/109; 117/105; 117/106; 118/723
(58) Field of Search ............................... 117/207, 202, 117/951, 106, 109; 118/72

(56) References Cited

U.S. PATENT DOCUMENTS

| | | | |
|---|---|---|---|
| 5,010,035 A | * | 4/1991 | Bunshah et al. ............ 117/951 |
| 5,288,326 A | | 2/1994 | Maeda et al. |
| 5,604,151 A | * | 2/1997 | Goela et al. ................ 437/100 |
| 5,704,985 A | * | 1/1998 | Kordina et al. ............. 118/725 |
| 6,030,661 A | | 2/2000 | Kordina et al. |
| 6,039,812 A | | 3/2000 | Ellison et al. |
| 6,193,797 B1 | * | 2/2001 | Shiomi et al. ................ 117/88 |

FOREIGN PATENT DOCUMENTS

| JP | A-2-157196 | 6/1990 |
|---|---|---|
| WO | WO 00/43577 | 7/2000 |

* cited by examiner

Primary Examiner—Robert Kunemund
(74) Attorney, Agent, or Firm—Posz & Bethards, PLC

(57) ABSTRACT

A crucible has first member and second cylindrical body, and is disposed in a lower chamber. The fist member is disposed in the second cylindrical body so as to define a gas flow path formed therebetween as a gap. A pedestal is disposed inside the first member. A seed crystal is fixed to the pedestal. SiC single crystals are formed on the pedestal by introducing a mixture gas through an inlet conduit. During growth of the SiC single crystals, conductance in introduction of the mixture gas into the crucible is larger than that in exhaust of the mixture gas, so that pressure of the mixture gas in the crucible is larger than that of the mixture gas after exhausted from the crucible.

7 Claims, 3 Drawing Sheets

MANUFACTURING METHOD FOR PRODUCING SILICON CARBIDE CRYSTAL USING SOURCE GASES AND APPARATUS FOR THE SAME

CROSS REFERENCE TO RELATED APPLICATION

This application is based upon Japanese Patent Application No. 2000-343663 filed on Nov. 10, 2000, the contents of which are incorporated herein by reference.

BACKGROUND OF THE INVENTION

1. Field of the Invention

The present invention relates to manufacturing method for producing single-crystal silicon carbide that has low defects and high quality, and apparatus suitable for the same.

2. Related Art

Silicon carbide (hereinafter, SiC) has been developed as a semiconductor substrate for a power device because SiC has characteristics such as withstanding high voltage and high electron mobility. Generally, the single-crystal SiC is produced by single crystal growth method called sublimation (the Modified Lely Method).

In the Modified Lely Method, silicon carbide source material is held in a graphite crucible, and a seed crystal is held in the graphite crucible so as to face the source material. In this state, the source material is heated up to about 2200 to 2400° C. to generate sublimed gas while temperature of the seed crystal is kept to be lower than that of the source material by several ten to several hundred ° C., whereby the sublimed gas is recrystallized at a growth surface of the seed crystal to form SiC single crystals.

However, there is limit to growth in the Modified Lely Method as the source material decreases in accordance with growth of the SiC single crystals. Although new source material can be added, SiC is sublimed at a rate in which Si to C is more than 1, so that concentration of the sublimed gas vacillates when the new source material is added in the middle of growth, thereby preventing crystals from growing in high quality successively.

On the other hand, epitaxial growth method of SiC single crystals by CVD (Chemical vapor Deposition) is disclosed in JP-A-11-508531 (U.S. Pat. No. 6,039,812). FIG. 3 shows a schematic cross sectional view of an apparatus for the epitaxial growth method described in the above-mentioned publication. As shown in FIG. 3, a susceptor 2 as a crucible disposed approximately at a center of a case 1 having a cylinder shape. The susceptor 2 is composed of high-purity graphite or the like. SiC single crystal substrate is disposed on an inner surface of the susceptor 2 at an upper side thereof as a seed crystal for epitaxial growth. Heater 4 is provided at an outside portion of the case 1 where the susceptor 2 is disposed inside of the case 1 to heat gases inside of the susceptor 2.

Space surrounding the susceptor 2 is filled with thermal insulator 5 composed of porous graphite. An inlet conduit 6 having a funnel shape is located under a bottom of the susceptor 2 that is formed by the thermal insulator 5. A supplying portion 7 is located at a bottom of the case 1 to supply a mixture gas while outlet conduits 8 are disposed at a top of the susceptor 2 to exhaust the mixture gas. Moreover, a conduit 9 is disposed at upper side of the case 1 that communicates outside of the case 1.

In this apparatus constituted described above, the mixture gas supplied by the supplying portion 7 is transferred to the susceptor 2 through the inlet conduit 6 formed by the thermal insulator 5, and the mixture gas is heated by the heater 4 and epitaxial growth occurs on the seed crystal 3 as silicon carbide single crystals. Remaining mixture gas is exhausted through the outlet conduits 8 disposed at the top of the susceptor 2, and the conduit 9 disposed at the upper side of the case 1.

However, as shown in FIG. 3, in an invention as described in JP-A-11-508531, difference in size between the inflow port 6 and the outflow port (the outlet conduit at the upper side of the susceptor 2) 8 for the mixture gas at the susceptor 2 is small. Therefore, there is little difference in pressure between the inside of the susceptor 2 and the outside of the susceptor 2. In such a situation where the difference in pressure does not exist, the mixture gas introduced inside the susceptor 2 tends not to remain there and to be exhausted from the outflow port 8.

Therefore, the mixture gas does not contribute to the growth of SiC single crystals sufficiently and is exhausted. Thus, plenty of the mixture gas must be introduced into the susceptor 2. As a result, yield is small, which corresponds to a rate of mol of SiC single crystals to mol of Si and C in the mixture gas introduced into the susceptor 2.

The present invention has been made in view of the above-mentioned problem, and an object thereof is to provide a manufacturing method of silicon carbide single crystals that is improved in yield, and an apparatus for the same.

SUMMARY OF THE INVENTION

The present invention has been made in view of the above problems. An object of the present invention is to provide a manufacturing method for producing silicon carbide single crystals, by which yield of silicon carbide single crystals is improved, and a manufacturing apparatus of the same.

According to a first aspect of the present invention, a silicon carbide single crystal substrate is disposed in a crucible, and a gas containing Si and a gas containing C are introduced into the crucible, whereby silicon carbide single crystals grow on the silicon carbide single crystal substrate. Specially, the method is characterized in that pressure in a growth room, in which the silicon carbide single crystals grow on the silicon carbide single crystal substrate, is set bigger than that after exhausted from the growth room.

According to a second aspect of the present invention, after the mixture gas is introduced into the crucible, the mixture gas is returned in an opposite direction with respect to an introduced direction of the mixture gas, and then the mixture gas is transferred to the introduced direction thereof.

According to a third aspect of the present invention, conductance in introducing the mixture gas into the crucible is made bigger than that in exhausting the mixture gas from the crucible.

Preferably, sectional area of the inflow port through which the mixture gas is introduced into the crucible is set bigger than that of the outflow port from which the mixture gas is exhausted.

Preferably, said crucible has a first member, a second member having a wall portion at a bottom thereof. The wall has an opening. The first member is disposed inside the second member with gap formed therebetween. The silicon carbide single crystal substrate is disposed inside of the crucible at an opposite side with respect to the wall. The mixture gas introduced through the opening reaches the silicon carbide single crystal substrate, then, passes through an interval formed between a tip portion of the first member and the wall portion, and then, is exhausted outside of the crucible through the gap formed between an inner wall of the second member and an outer wall of the first member.

Thus, the apparatus, which preferably performs the manufacturing method of silicon carbide single crystals described in the second aspect of the present invention, can be provided.

Moreover, the crucible has a structure by which conductance in introducing the mixture gas into the crucible is made bigger than that in exhausting the mixture gas from the crucible.

Thus, residence time of the mixture gas in the crucible can be lengthened, whereby a lot of components in the mixture gas can contribute to crystal growth on the silicon carbide single crystal substrate.

Preferably, sectional area of an inflow port of the crucible through which the mixture gas is introduced is set larger than that of an outflow port of the crucible from which the mixture gas is exhausted.

Preferably, a protruding portion having a communicating path that communicates an inlet conduit for introducing the mixture gas into the crucible to a growth room in the crucible, is provide to the crucible so as to protrude to the silicon carbide single crystal. Sectional area of the communicating path at a side where the introducing conduit is disposed is set to be small with respect to sectional area of the communicating path at a side where the growth room is disposed.

Thus, flow rate of the mixture gas at the vicinity of the silicon carbide single crystal substrate can be slowed down. Therefore, the mixture gas can be remained at the vicinity of the silicon carbide single crystal substrate for long time. Therefore, a lot of components in the mixture gas can contribute to crystal growth on the silicon carbide single crystal substrate.

Preferably, sectional area of the communicating path is gradually increased from the introducing conduit to the growth room.

Preferably, the silicon carbide single crystal substrate is fixed on a surface of a substrate fixing pedestal while gas is provided to an opposite surface of the pedestal.

other objects and features of the present invention will become more readily apparent from a better understanding of the preferred embodiment described below with reference to the following drawings.

DETAILED DESCRIPTION OF THE PREFERRED EMBODIMENT

First Embodiment

Figure 1:
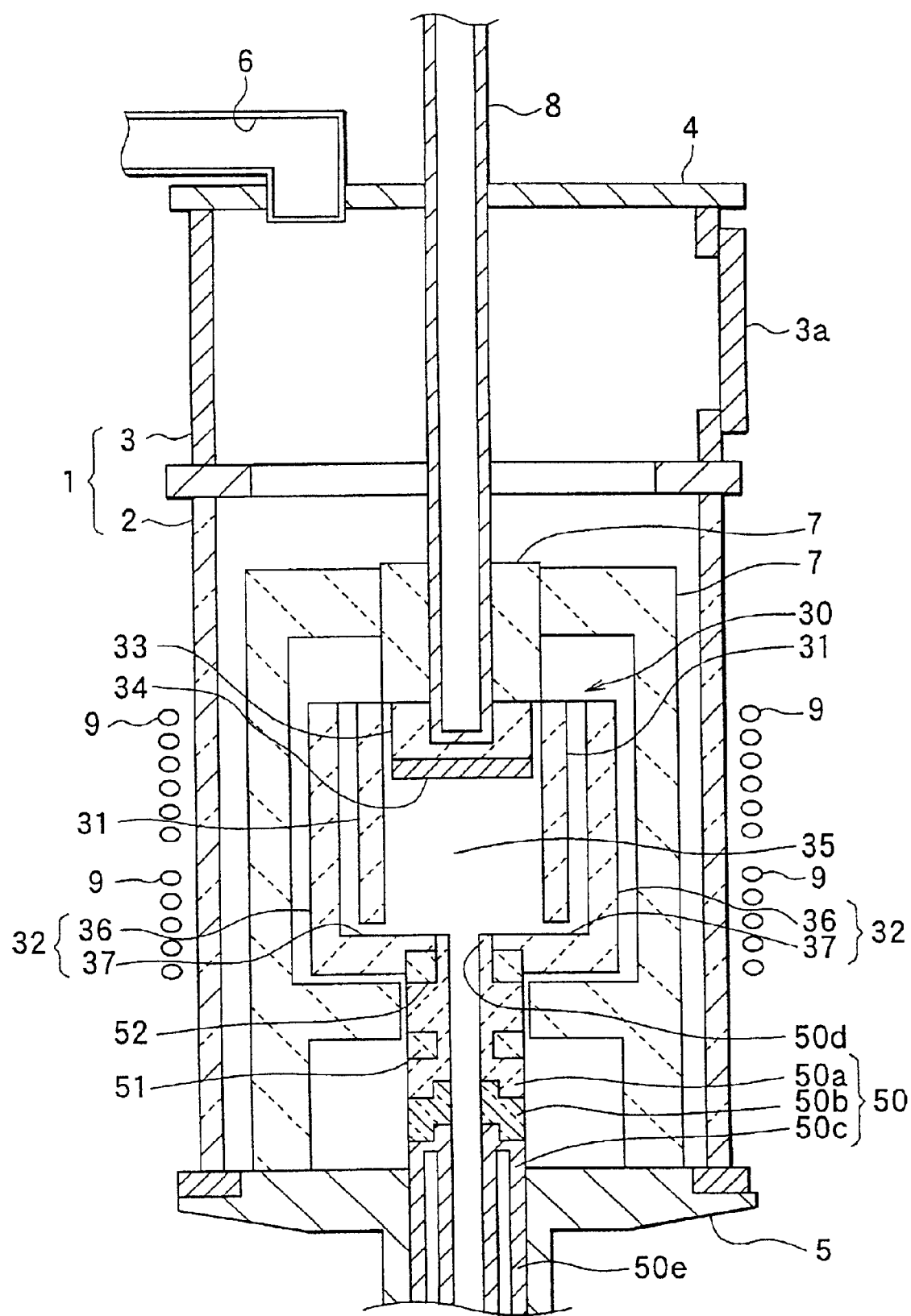
FIG. 1 is a schematic cross sectional view of a manufacturing apparatus in the first embodiment of the present invention.

Hereinafter, an embodiment will be explained. FIG. 1 shows an apparatus for producing silicon carbide single crystals (hereinafter, merely referred to as an apparatus). As shown in FIG. 1, cylindrical chamber 1 has a lower chamber 2 that is a portion to hold a crucible, and an upper chamber 3 that is a portion to take out a completed silicon carbide (SiC) so that space formed in the lower chamber 2 communicates to space formed in the upper chamber 3.

The upper chamber 3 is composed of, for example, a SUS (stainless steel), and has a sample take-out port 3a for taking out SiC single crystals that finishes crystal growth. An opening at an upper side of the upper chamber 3 is covered with a top lid 4 composed of, for example, the SUS. An exhaust pipe 6 is connected to the top lid 4, and is connected to a vacuum pump (not shown). An inside of the chamber 1 is controlled in pressure by the vacuum pomp so as to draw a vacuum.

The lower chamber 2 is composed of, for example, quartz, and an opening at a lower side for the lower chamber 2 is covered with a bottom lid 5 composed of, for example, the SUS (stainless steel). The crucible 30 is disposed inside the lower chamber 2 and surrounded by a heat insulating material.

The crucible has first member 31 and second member 32. The first member 31 has a cylindrical body (first cylindrical member). A SiC single crystal substrate fixing pedestal 33 (hereinafter, merely referred to as a pedestal) is disposed at a side close to the upper chamber 3 (an opposite side to a wall described below mentioned in claims) inside the first member 31 so that gap is formed between the pedestal 33 and inner wall of the upper chamber 3. A silicon carbide single crystal substrate 34 is fixed on one surface of the pedestal 33. The SiC single crystals grow on the silicon carbide single crystal substrate 34 as a seed crystal in space 35 provided inside the first member 31. Hereinafter, the silicon carbide single crystal substrate 34 is referred to as a seed crystal, the space 35 inside the first member 31 is referred to as a growth room.

For example, high purity graphite capable of withstanding high temperature (for example, 2400° C.) can be employed to material for the first member 31. The inner wall of the first member 31 is coated with refractory metal such as TaC. Thus, when mixture gas is introduced into the growth room 35 as described below, the inner wall of the first member 31 is prevented from deteriorating by impact of the mixture gas thereto, thereby preventing C that would be generated from the first member 31 from being airborne. As a result, a partial pressure ratio between C and other constituent of the mixture gas is kept constant.

The second member 32 has a cylindrical body (second cylindrical member) 36 and a wall 37. The wall 37 is provided at an end located far from the upper chamber 3 in the cylindrical body 36. An opening is partially provided approximately at a center of the 37. The outside of the second member 32 communicates to the inside of the cylindrical body 36. The high purity graphite, for example, also can be employed to material for the second member 32.

The first member 31 is disposed inside of the second member constituted in a manner as described above, a gap is formed between an outer wall of the first member and an inner wall of the second cylindrical body 36, and a gap is formed between a tip portion of the first member that is located at the opposite side to the side where the seed crystal 34 is disposed.

The mixture gas introduced into the crucible 30 is exhausted from the crucible 30 through the gaps described above. These gaps are narrowed to such a degree that exhaust of the gas is limited. Namely, the crucible 30 is constituted in such a manner that conductance in introducing the mixture gas into the crucible 30 is bigger than that of conductance in exhausting the mixture gas to the outside of the crucible 30. Therefore, the mixture gas introduced into the growth room 35 tends not to be exhausted from the crucible 30, so that residence time of the mixture gas in the growth room 35 becomes longer. Incidentally, the conductance denotes easiness in flow of the mixture gas.

Incidentally, a portion of the first cylindrical body at the side of the upper chamber 3 and a portion of the second cylindrical body at the side of the upper chamber 3 are connected with each other to unite with each other.

Such the crucible 30 is constituted as follows, in other words. That is, the crucible 30 has a cylindrical member corresponding to the first member 31 a glass-shaped member corresponding to the second member 32. The cylindrical member is disposed inside the glass-shaped member, an end portion at an inlet side of the glass-shaped member and one end portion of the cylindrical member are positioned at the same plane, and a gap is formed between the other end portion of the cylindrical member and a bottom of the glass-shaped member. Besides, the bottom of the glass-shaped member is opened approximately at the center thereof to communicate the outside of the bottom of the glass-shaped member to the inside of the cylindrical member.

On the other hand, an inlet conduit 50 is connected to the wall 37 of the second cylindrical member 36 so that the inlet conduit 50 communicates with the growth room 35. The mixture gas for crystal growth of SiC is introduced to the growth room through the inlet conduit 50.

The inlet conduit 50 is constituted in such a manner that thermal gradient is generated so that temperature of the inlet conduit 50 rises as a portion in the inlet conduit 50 comes close to the crucible 30. In this embodiment, the inlet conduit 50 is composed of three parts. Starting from an outlet portion 50d where the mixture gas is exhausted into the growth room 35, first inlet conduit 50a, second inlet conduit 50b, and third inlet conduit 50c are arranged in this order.

The first inlet conduit 50a is located at a top portion of the inlet conduit 50 where the outlet portion 50d is located, and therefore, disposed close to the crucible 30. Accordingly, the first inlet conduit 50a is composed of material capable of withstanding high temperature such as, for example, graphite. First thermal insulator 51 is disposed so as to apply the thermal gradient to the first inlet conduit 50a.

Moreover, second thermal insulator 52 is disposed between the first inlet conduit 50a and the crucible 30. Thus, amount of heat transfer from the crucible 30 that is heated up to high temperature to the first inlet conduit 50a is reduced, whereby the thermal gradient is preferably generated in the first inlet conduit 50a.

By such the structure, temperature at a portion in the first inlet conduit 50a that is located tinder the first heat insulator 51 can be set at 500° C. Specifically, porous graphite can be employed as a material for the first and second heat insulator 51 and 52.

The second inlet conduit 50b is provided to restrain heat conduction from the first inlet conduit 50a to the third inlet conduit 50c. Therefore, the second inlet conduit 50b is composed of a material that has low thermal conductivity such as, for example, quartz. The third inlet conduit 50c is composed of, for example, metal, more specially, SUS (stainless steel). The third inlet conduit 50c is equipped with, for example, a cooling structure that cools down the third inlet conduit 50c with water, for example.

Here, when surface roughness Ra is set as an average of difference in dimension between protruding portions and hollow portions at a surface of the inside of the inlet conduit 50 along a direction perpendicular to the surface thereof, the surface roughness Ra of the inner surface of the inlet conduit 50 is set at 7 $\mu$m or less, preferably 1 $\mu$m or less.

This is because, especially in the first inlet conduit 50a, temperature of the mixture gas rises at high (for example, 500° C. or more), so that deposits of the mixture gas tend to deposit on the inner surface of the first inlet conduit 50a. Therefore, when the surface roughness Ra is restrained, contact area is reduced where the mixture gas contacts to the inner surface of the first inlet conduit 50a, so that flow rate of the mixture gas near the inner surface of the first inlet conduit 50 is prevented from being lowered. As a result, the inlet conduit 50 is prevented from being plugged.

Further, a portion of the inlet conduit 50 at an opposite side of the outlet portion 50d penetrates a lower lid 5 to reach an external of the chamber 1. Although not shown, a mass flow controller is equipped that is located at a further lower side to control flow of the mixture gas that flows into the inlet conduit 50. Moreover, although not shown, a pyrometer is equipped that is located under the inlet conduit 50 to measure temperature at a surface of the SiC single crystals in process of crystallization or the surface of the seed crystal 34 through the inlet conduit 50.

A lifting shaft (hereinafter, merely referred to as a shaft) 8 is fixed to other side of the pedestal 33 that is opposite to the side where the seed crystal 34 is fixed, to lift the seed crystal 34 to a direction opposite to a growth direction of the SiC single crystals. The shaft 8 has a tube shape, a portion thereof close to the crucible 30 is composed of quarts, and a portion far from the crucible 30 is composed of SUS (stainless steel). A pyrometer is equipped at an upper side of the shaft 8 to measure temperature of the pedestal 33. Incidentally, the shaft 8 is also surrounded with the heat insulator 7 in the neighborhood of the crucible 30.

A temperature rising means 9 is provided outside the chamber 1, which is located at the same level to the crucible 30. An RF (Radio Frequency) coil 9 is employed as the temperature rising means 9. In this embodiment, the RF coil has an upper coil and a lower coil independent with each other, so that temperature of an upper portion of the chamber 1 is controlled independent from that of a lower portion of the chamber 1. Moreover, although not shown, an x-ray apparatus is disposed outside the chamber 1.

Next, manufacturing method of SiC single crystals will be explained, which is performed using such the manufacturing apparatus. First, the seed crystal 34 is fixed on the one surface of the pedestal 33, and disposed at a predetermined position inside the growth room 35 by positioning using the shaft 8.

Next, the inside of the chamber 1 is vacuumed while Ar gas is introduced through the inlet conduit 50. After that, the crucible 30 is inductively heated up by applying electrical power to the RF coil 9. Then, temperature of the crucible 30 is stabilized at a predetermined temperature (over the temperature in melting point of Si), and pressure in the crucible 30 is set at a predetermined pressure. Thus, the crucible 30 surrounded by the heat insulator 7 is heated up at high temperature uniformly, and the temperature gradient is applied to the inlet conduit 50 so that temperature therein increases as the portion in the inlet conduit 50 comes close to the crucible 30.

In this embodiment, the first and second heat insulators 51 and 52 are disposed at the crucible 30. The porous graphite is capable of withstanding high temperature and is porous, thereby being prevented from being inductively heated up by the RF coil 9. Therefore, by employing the porous graphite as the heat insulators 51 and 52, the temperature gradient is preferably applied to the inlet conduit 50. Incidentally, temperature at a portion in the first inlet conduit 50a under the first heat insulator 51 is set approximately at 500° C.

The mixture gas is introduced into the crucible 30 with carrier gas through the inlet conduit 50. The mixture gas includes a gas containing Si and a gas containing C. Specially, $SiH_4$, $C_3H_8$, $H_2$, and $N_2$ are used as the mixture gas.

In these gases, $SiH_4$ and $C_3H_8$ are the gases for forming SiC single crystals. Moreover, $H_2$ forms hydrocarbon by combining with excess carbons at a surface of SiC single crystal so that $H_2$ prevents the surface of SiC single crystal from being carbonized. Moreover, $N_2$ is a dopant gas and introduced to form n-type conductive SiC. Incidentally, trimethylaluminium gas or the like is used and introduced Al to form p-type conductive SiC.

Incidentally, the carrier gas is used for increasing gas flow in the inlet conduit 50, and Ar is employed, for example.

As described above, by introducing the mixture gas into the crucible 30 through the inlet conduit 50 where the temperature gradient is applied, the mixture gas is not heated up rapidly after introduced into the crucible 30, but the mixture gas at high temperature that is heated up when passing through the inlet conduit 50. Therefore, silicon carbide single crystals having high quality can be formed.

In this case, when the temperature of the mixture gas rises and exceeds such a degree at 500° C., there is possibility that $SiH_4$ runs into the inner surface of the inlet conduit 50 so that Si deposits on the inner surface. However, the deposition is prevented if the mixture gas is transferred to a high temperature region of the inlet conduit where Si and SiC sublime.

In this embodiment, the mixture gas is transferred to a higher temperature region by applying the thermal gradient to the inlet conduit 50. Volume of the mixture gas is expanded as temperature thereof rises. Therefore, the flow rate of the mixture gas increases as the temperature thereof rises. Moreover, since the carrier gas is mixed with the mixture gas, the flow rate in the inlet conduit 50 can be faster.

As described above, the mixture gas can be transferred to the higher temperature region, so that the inlet conduit 50 is prevented from being plugged with the mixture gas.

Incidentally, the mixture gas that is introduced into the crucible 30 through the inlet conduit 50 is crystallized on the seed crystal or the SiC single crystals that has already been crystallized on the seed crystal. Crystallinity of the SiC single crystals in this time varies based on crystallinity of the seed crystal 34 or a condition of the temperature in the crucible 30 or the like, so that the SiC single crystals grow as 4H—SiC or 6H—SiC or the like.

After that, the mixture gas passes through the gap between the tip portion of the first member 31 and the wall 37 of the second member 32 (the bottom of the glass-shaped member), and the gap between the outer wall of the first member 31 and the inner wall of the second cylindrical portion 36, then, the mixture gas is exhausted to the outside of the crucible 30.

Namely, the mixture gas is introduced into the growth room 35 in the crucible 30 and contributes to the crystal growth, and then, returns to an opposite direction to an introduced direction of the mixture gas in the growth room 35, after that, the mixture gas is transferred to the introduced direction of the mixture gas in the growth room 35 again so as to be exhausted from the crucible 30. That is, the crucible 30 is partitioned with the first member 31, so that the mixture gas meanders in the crucible 30 so as not to be exhausted easily.

As a result, pressure of the mixture gas in the crucible 30 is greater than that outside of the crucible 30. That is, concentration of the mixture gas in the growth room in a situation where difference in pressure is provided between inside and outside of the crucible 30. Therefore, a lot of components in the mixture gas can be crystallized as silicon carbide single crystals.

Incidentally, since the crucible 30 is composed of the high purity graphite, it is reduced that impurity comes out from the crucible 30 and is taken into the crystals during growth, whereby the SiC single crystals become high quality. Moreover, as described above, since the refractory metal is provided on the inner surface of the first member 31, partial pressure ratio between C and Si in the mixture gas is kept constant when the mixture gas is introduced in the crucible 30, and epitaxial SiC single crystals grow on the seed crystal 34 suitably.

Incidentally, in this embodiment, by adjusting each output of RF coils that are independent from each other in high and low, temperature of the mixture gas exhausted from the crucible at an exhaust portion of the crucible 30 is higher than that of the mixture gas introduced into the crucible 30 at an introducing portion of the crucible 30. Generally, since deposits (for example, that are composed of solidified ingredients of polycrystalline silicon or the like in the mixture gas) due to the mixture gas tend to accumulate on a portion where temperature thereof is lower than other portions on the periphery thereof, the exhaust portion is prevented from being plugged with the deposits due to the mixture gas when the mixture gas is exhausted from the crucible 30 by rising the temperature at the exhaust portion.

Namely, since SiC vapor pressure becomes high at a high temperature portion, polycrystalline silicon is prevented from being deposited on the exhaust portion so that the gas is exhausted from the crucible 30 smoothly. Incidentally, in the embodiment shown in the drawing, the introducing portion denotes a portion in the wall 37 that is connected to the inlet conduit 50, and the exhaust portion denotes the gap formed with first member 31 and the second cylindrical body 36.

Then, when the crystal growth is stopped, the mixture gas is stopped being supplied and the temperature is lowered by decreasing electrical power supply of the RF power. After that, the SiC single crystals is transferred to the upper chamber 3, and pressure in the upper chamber 3 is risen to atmospheric pressure, and then, the SiC single crystals are taken from the sample take-out port 3a.

As described above, residence time of the mixture gas can be lengthened in the growth room 35, so that yield is improved, which is defined as a ratio of mol of SiC single crystals grown on the seed crystal 34 to mol of Si and C in the mixture gas.

More specifically, reaction occurs in the crucible 30 such as $3SiH_4(gas)+C_3H_8(gas)+Ar(gas)$. $3SiC(solid)+10H2(gas)+Ar(gas)$ or the like. Therefore, although an exhaust gas is composed of hydrogen and argon ideally, $SiH_4$ and $C_3H_8$ are exhausted from the crucible 30 without forming SiC when the residence time of the gas in the crucible 30 is short. Therefore, degree of reaction between $SiH_4$ and $C_3H_8$ become close to ideal state when the mixture gas stays at crucible 30 as described in this embodiment, so that the mixture gas contributes to the crystal growth on the seed crystal 34 at high yield, whereby the yield is improved.

Incidentally, during the crystal growth, temperature of the seed crystal 34 or the SiC single crystals is measured by the pyrometer equipped beneath the inlet conduit 50, and the temperature can be set under that of the crucible 30. Therefore, although change in temperature caused by arrangement of crucible 30 and pedestal 33 or by deterioration with heat may occur, the mixture gas can be crystallized on the surface of the seed crystal 34 or the SiC single crystals at constant temperature.

Incidentally, in the manufacturing apparatus described above, the pedestal 33 is connected to the shaft 8 so as to be lifted up to an upper direction (direction of the upper chamber 3) according to progress of the crystal growth of SiC single crystals. Therefore, the crystals can grow long successively.

Second Embodiment

Figure 2:
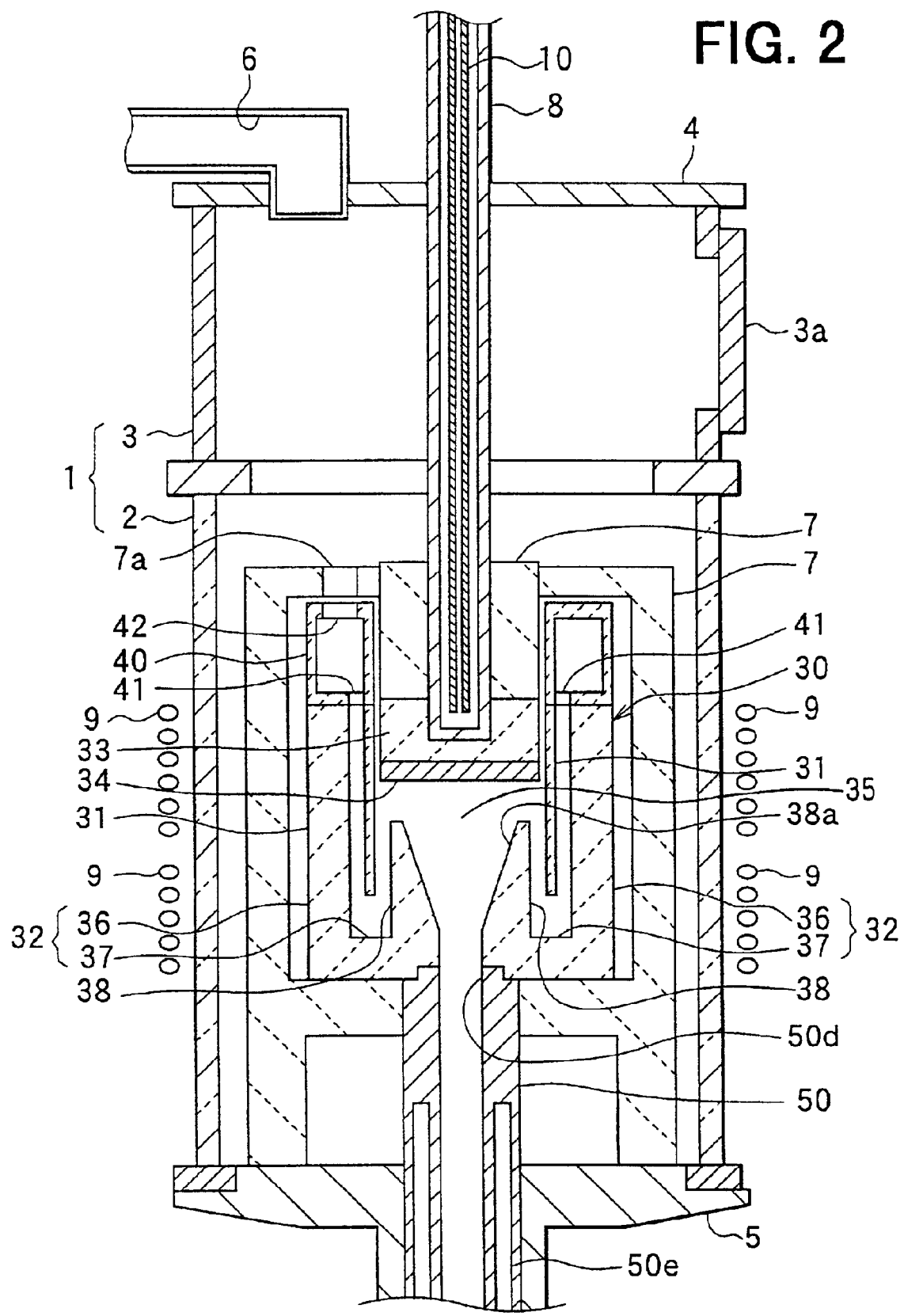
FIG. 2 is a schematic cross sectional view of a manufacturing apparatus in the second embodiment of the present invention.
Figure 3:
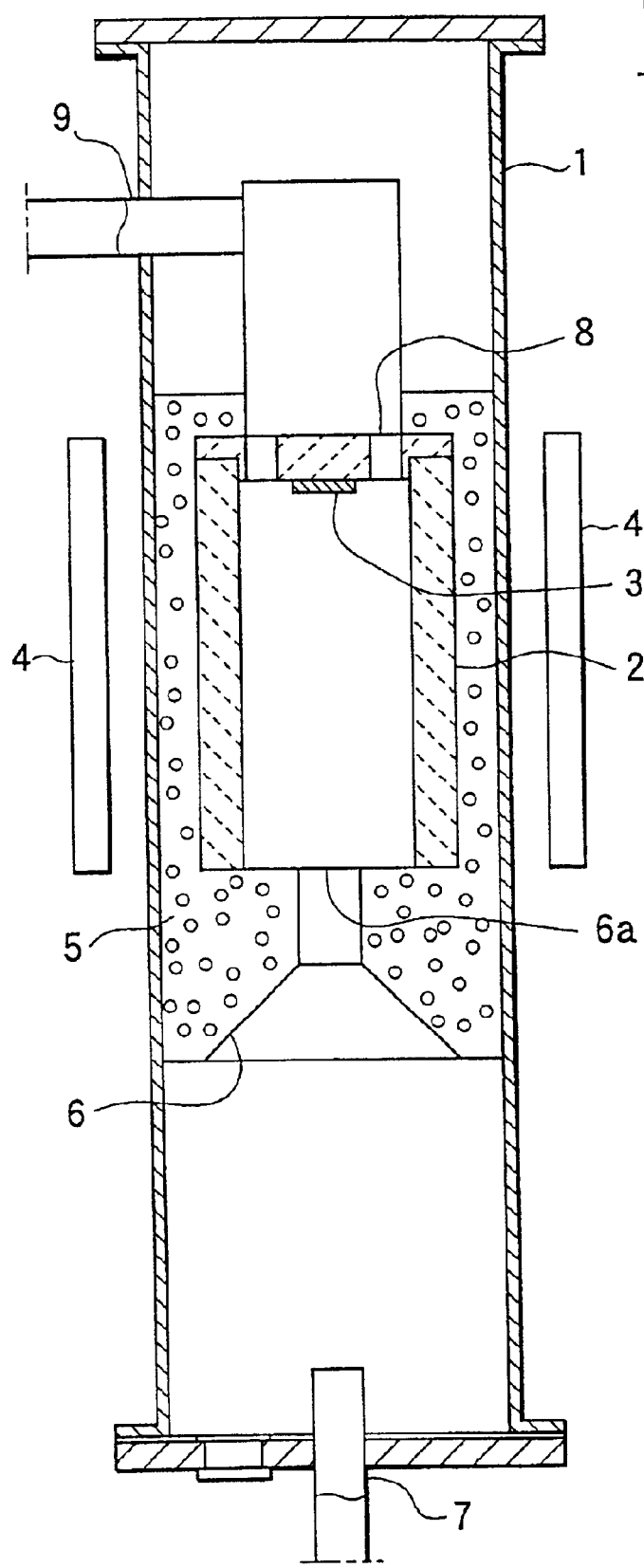
FIG. 3 is a schematic cross sectional view of a manufacturing apparatus in the prior art.

FIG. 2 shows a schematic cross sectional view of a manufacturing apparatus regarding second embodiment. Hereinafter, different portions from the first embodiment are described mainly, and the same component parts are designated by the same reference numerals so that description thereof is omitted.

In this embodiment, second member 32 is different in shape from that in the first embodiment. As shown in FIG. 2, a protrusion 38 is provided at a center portion of a wall 37 in the second member 32. The protrusion 38 is provided so as to protrude to the inside of second cylindrical body 36, and a communicating path 38a, which communicates the inside of the second cylindrical body 36 to the outside of second member 32, is formed inside the protrusion 38. In the communicating path 38a, sectional area of a portion thereof at a side of an inlet conduit 50 is set to be smaller than that of a portion thereof at a side of a growth room 35. More specifically, the sectional area of the communicating path 38a become large gradually from the inlet conduit 50 to the growth room 35, and convex and concavity such as a step or the like is not formed on a surface thereof.

The first member 31 intervenes between the second cylindrical body 36 and the protrusion 38, and a gap is formed between a wall 37 and a tip portion of the first member that is located at a side of the wall 37. Thus, the protrusion 38 is set to protrude from the wall 37 to a seed crystal 34, and a structure is provided in such a manner that the inlet conduit 50 communicates to the growth room 35 through the communicating path 38a.

When features of the crucible 30 described above are rephrased similar to the first embodiment, they have structures as follows. The protrusion 38 is formed approximately at a center of a bottom of a glass-shaped member corresponding to the second member 32 to protrude to a direction of an open end of the glass-shaped member, and the communicating path 38a, which communicates the outside of the crucible 30 and a space (growth room 35) formed inside a cylindrical body corresponding to the first member 31, is formed in the protrusion 38. Moreover, the inlet conduit 50 is communicated to the growth room 35 through the communicating path 38a.

In the communicating path 38a formed as described above, since the sectional area thereof located at the side of the growth room 35 is larger than that located at the side of the inlet conduit 50, flow rate of the mixture gas is slowed at the vicinity of the seed crystal 34. Thus, the mixture gas can stay at around the seed crystal 34 for a long time. Therefore, a lot of components in the mixture gas can be crystallized to grow, so that yield of SiC single crystals is improved.

Here, in a case in which steps are formed on a surface of the communicating path 38a, there is possibility that the mixture gas stays there, then, a gas, which is not suitable for the crystal growth, is formed.

However, in this embodiment, the sectional area of the communicating path 38a increases gradually from the inlet conduit 50 to the growth room 35, and the surface of the communicating path 38a is formed smoothly so as not to have the steps or the like thereon, whereby the gas is prevented from staying at the communicating path 38a.

Moreover, as a different portion from the first embodiment, a structure is formed so as to supply a cooling gas to an opposite side to the seed crystal 34 in the pedestal 33. More specifically, as shown in FIG. 2, a cooling gas conduit 10 is provided inside the shaft 8 so as to supply the cooling gas to vicinity of the pedestal 33. Ar gas is employed as the cooling gas, for example, Ar gas can be supplied to other surface of the pedestal 33 at a flow rate of 5 liters per minute through the cooling gas conduit 10.

As described above, by supplying the cooling gas, temperature of a surface of the seed crystal 34 or a surface of the SiC single crystals grown on the seed crystal 34 can be set to be lower than that of the crucible 30. Accordingly, a lot of components in the mixture gas can be crystallized to grow on the seed crystal 34, so that yield of SiC single crystals is improved.

Incidentally, since the gas is supplied to the vicinity of the pedestal 33 using the cooling gas conduit 10, the seed crystal 34 or the SiC single crystals grown on the seed crystal 34 can be cooled with a small amount of the gas.

Moreover, as a different portion from the first embodiment, a gas trap 40 is provided at a side of the upper chamber 3 as a room for passing the gas exhausted from the growth room 35 through. The gas trap 40 is lowered in temperature in comparison with the growth room 35. Incidentally, in the gas trap 40, an opening 41, which communicates to an exhaust portion of the crucible 30, is formed on one face located at a side close to the crucible 30, and an opening 42 is formed on other face located at a side opposite to the crucible 30. An opening 7a is formed in a heat insulator 7 so as to be located in accordance with the opening 42.

As described above, since the gas trap 40 is provided, the mixture gas exhausted from the crucible 30 passes through the gas trap 40. Since deposits due to the mixture gas tend to accumulate at a portion where temperature is low, the deposits accumulate on the gas trap 40. Therefore, constituents of the mixture gas are solidified so that concentration of the constituents in the mixture gas can be reduced. As a result, an exhaust conduit 6 is prevented from being plugged with the deposits due to the mixture gas.

Furthermore, since the deposits accumulate on a wall of the gas trap 40, a flow path of the gas in the gas trap 40 is secured sufficiently. Moreover, the gas trap 40 may be provided as a separated body from the crucible 30 so as to be changed for a new one when amount of the deposits increases.

Incidentally, in this embodiment shown in FIG. 2, although a distance between the tip portion of the first member and the wall 37 is wider than that in the first embodiment shown in FIG. 1, when the mixture gas tends not to be exhausted from the crucible 30 with a structure constituted with the first member 31 and the second member 32, the distance between the tip portion of the first member and the wall 37 may be wider.

Incidentally, in the first embodiment described above, although the inlet conduit 50 is constituted with three different parts, and thermal gradient is applied thereto by providing the first and second heat insulator 51 and 52, the inlet conduit 50 may be constituted with one part (or two parts), and the first and second heat insulator 51 and 52 may not be provided thereto.

In the above-mentioned embodiments, although the residence time of the mixture gas is lengthened in the growth room 35 by exhausting the mixture gas through a long path that is narrowed by mainly adjusting the gap formed between the first member 31 and the second member 32, a structure can be employed so as to lengthen the residence time of the mixture gas in the growth room 35, which is constituted in such a manner that sectional area of an introducing mouth for introducing the mixture gas into the crucible 30 is larger than that of an exhaust mouth for exhausting the mixture gas 30 from the crucible 30.

Moreover, even if the crucible 30 has any kinds of shape, when flow of the mixture gas in the crucible 30, especially the growth room 35, is a viscous flow, the residence time of the mixture gas is lengthen in the crucible 30, whereby the yield of SiC single crystals is improved suitably.

Further, in the above-mentioned embodiments, although the first member 31 is provided with the refractory metal on the inner wall thereof so as to be prevented from deteriorating by the mixture gas, the refractory metal may not be provided when deterioration of the first member can be neglected.

Further, in the above-mentioned embodiments, although Ar gas is employed as the carrier gas, inert gas such as He or the like can be employed in addition to Ar gas. Furthermore, although $H_2$ gas is included in the mixture gas, $H_2$ gas may be employed as a carrier gas since both $H_2$ and He have high thermal conductivity in comparison with $SiH_4$ and $C_3H_8$, these gases can absorb heat on the seed crystal 34 or the SiC single crystals when reaching. Therefore, surface of the seed crystal 34 or the SiC single crystals is cooled down in comparison with the crucible 30, the crystal growth of SiC is encouraged so that the yield is improved.

Next, experimental example will be described with reference to description of the first embodiment.

First, the seed crystal 34 was fixed to the pedestal 33, and disposed at a predetermined place in the crucible 30. At that time, the seed crystal was disposed so that a (0 0 0 1) Si face of 6H—SiC faces the growth room 35.

Then, the chamber 1 was vacuumed, and Ar was introduced into the chamber 1 at a rate of 10 liters per minute through the inlet conduit 50. Moreover, electrical power was supplied to the RF coil 9, so that the crucible was heated up to 2400° C.

After that, when temperature of the crucible 30 became stable at 2400° C. pressure in the chamber 1 was set at $2.66 \times 10^4$ Pa. and the mixture gas and the carrier gas described above were introduced into the crucible 30 while flows thereof were controlled by the mass flow controller. The flows of $SiH_4$, $C_3H_8$, $H_2$ gas $N_2$, and Ar were set to 1 liter per minute, 0.27 liters per minute, 1 liter per minute, 0.4 liters per minute, and 5 liters per minute, respectively.

During the crystal growth, surface temperature of the seed crystal 34 or the SiC single crystals grown on the seed crystal 34 were measured by the pyrometer disposed beneath the inlet conduit 50, and controlled to be at 2350° C.

Moreover, temperature distribution and gas concentration distribution were uniformed at the surface of the seed crystal 34 or the SiC single crystals grown on the seed crystal 34 by rotating the shaft 8.

When one hour passed after start of the crystal growth, crystal growth amount was monitored during the crystal growth by observing a transmission image of the crucible 30 using an x-ray apparatus. As a result, growth rate was at 1.5 mm/hour based on the growth amount. The crystal growth was continued while the shaft 8 was lifted up according to the growth rate.

The crystal growth had been performed for 40 hours as described above, then supplies of $SiH_4$, $C_3H_8$, $H_2$ gas, $N_2$, and Ar gases were stopped, and the temperature was decreased by lowering the electric power of the RF power. After that, the SiC single crystals was transferred to the upper chamber 3, and pressure in the upper chamber 3 was risen to atmospheric pressure, and then, the SiC single crystals were taken from the sample take-out port 3a.

After the experiment described above, the yield of SiC single crystals was high efficiency of 20%, which was obtained from the fact based on input of $SiH_4$, $C_3H_8$.

Incidentally, measured growth amount of the SiC single crystals was measured 57 mm. The fact was found that a taken-out ingot of the SiC single crystals had temperature distribution and gas concentration distribution symmetrically with respect to a center thereof since the ingot had a facet of a (0 0 0 1) face at a grown surface thereof.

Moreover, a wafer having a thickness of 500 μm was sliced from the SiC single crystals and was polished. The SiC wafer was checked in Raman scattering spectroscopy characteristic, then, the wafer had a poly type of 6H—SiC. Besides, emission distribution on a plane of the wafer was checked by radiating He—Cd laser (325 nm) to the SiC wafer, then, the SiC wafer had the same poly type of 6H-SiC at whole surface thereof.

While the present invention has been shown and described with reference to the foregoing preferred embodiment, it will be apparent to those skilled in the art that changes in form and detail may be therein without departing from the scope of the invention as defined in the appended claims.

What is claimed is:

1. A manufacturing apparatus for producing silicon carbide single crystals comprising:

a crucible for disposing a silicon carbide single-crystal substrate therein as a seed crystal, wherein a mixture gas having a Si included gas and a C included gas is introduced into one end of the crucible, so that silicon carbide single crystals grow on said silicon carbide single-crystal substrate;

a pedestal for fixing the silicon carbide single-crystal substrate at one surface thereof, and being disposed in the crucible; and a cooling structure for supplying a cooling gas to an other surface of the pedestal at an opposite end of the crucible so as to cool the silicon carbide single-crystal substrate through the pedestal, wherein one of a temperature of a surface of the seed crystal and a surface of the SiC single crystals grown on the seed crystal is lower than a temperature of the crucible, and an exhaust portion of the crucible has a higher temperature than the temperature of the surface of the seed crystal to thereby substantially limit mixture gas deposits from sticking to the exhaust portion.

2. A manufacturing apparatus for producing silicon carbide single crystals according to claim 1, further comprising a conduit for supplying the cooling gas to the other surface of the pedestal.

3. A manufacturing apparatus for producing silicon carbide single crystals, comprising:
- a crucible having a growth room where a silicon carbide single-crystal substrate is disposed therein as a seed crystal and first and second members surrounding the substrate, a mixture gas having a Si included gas and a C included gas being introduced into said crucible, so that silicon carbide single crystals grow on said silicon carbide single-crystal substrate;
- an inlet conduit for introducing the mixture gas into the crucible; and
- a protrusion provided in the crucible such that the protrusion faces, and is tapered outwardly from, the inlet conduit towards the silicon carbide single-crystal substrate, said protrusion having a communicating path that connects the inlet conduit with the crucible, wherein
  - a sectional area of the communicating path at a side of the inlet conduit is smaller than that of the communicating path at a side of the growth room,
  - the first member is provided between the second member and the protrusion, and
  - the inlet conduit further comprises three parts, wherein starting from an outlet portion of the inlet conduit where the mixture gas is exhausted into the growth room,
  - a first part located at a top portion of the inlet conduit where the outlet portion is located and disposed near the crucible; the first part made of material capable of withstanding high temperature,
  - a second part adjacent to the first part and provided to restrain heat conduction from the first part; the second part made of a material that has low thermal conductivity, and
  - a third part adjacent the second part and equipped with a cooling structure that cools down the third part, the third part made of a metal material.

4. A manufacturing apparatus for producing silicon carbide single crystals, comprising:
- a crucible having a growth room where a silicon carbide single-crystal substrate is disposed therein as a seed crystal and first and second members surrounding the substrate, wherein a mixture gas having a Si included gas and a C included gas being introduced into said crucible, so that silicon carbide single crystals grow on said silicon carbide single-crystal substrate;
- an inlet conduit for introducing the mixture gas into the crucible;
- a first thermal insulator disposed so as to apply a thermal gradient to the inlet conduit, and a second thermal insulator disposed between the inlet conduit and the crucible; and
- a protrusion provided in the crucible such that the protrusion faces, and is tapered outwardly from, the inlet conduit towards the silicon carbide single-crystal substrate, said protrusion having a communicating path that connects the inlet conduit with the crucible, wherein
  - a sectional area of the communicating path at a side of the inlet conduit is smaller than that of the communicating path at a side of the growth room,
  - the first member is provided between the second member and the protrusion,
  - the inlet conduit further comprises three parts, wherein starting from an outlet portion of the inlet conduit where the mixture gas is exhausted into the growth room,
  - a first part located at a top portion of the inlet conduit where the outlet portion is located and disposed near the crucible: the first part made of material capable of withstanding high temperature,
  - a second part adjacent to the first part and provided to restrain heat conduction from the first part; the second part made of a material that has low thermal conductivity, and
  - a third part adjacent the second part and equipped with a cooling structure that cools down the third part, the third part made of a metal material.

5. A manufacturing apparatus for producing silicon carbide single crystals, comprising:
- a crucible for disposing a silicon carbide single-crystal substrate therein as a seed crystal, wherein a mixture gas having a Si included gas and a C included gas is introduced into one end of the crucible, so that silicon carbide single crystals grow on said silicon carbide single-crystal substrate;
- a pedestal for fixing the silicon carbide single-crystal substrate at one surface thereof, and being disposed in the crucible;
- a cooling structure for supplying a cooling gas to other surface of the pedestal at an opposite end of the crucible so as to cool the silicon carbide single-crystal substrate through the pedestal; and
- a gas trap provided at a side of the apparatus as an area for passing gas exhausted from the crucible,
- wherein one of a temperature of a surface of the seed crystal and a surface of the SiC single crystals grown on the seed crystal is lower than a temperature of the crucible.

6. A manufacturing apparatus for producing silicon carbide single crystals, comprising:
- a crucible for disposing a silicon carbide single-crystal substrate therein as a seed crystal, wherein a mixture gas having a Si included gas and a C included gas is introduced into one end of the crucible, so that silicon carbide single crystals grow on said silicon carbide single-crystal substrate;
- a pedestal for fixing the silicon carbide single-crystal substrate at one surface thereof, and being disposed in the crucible;
- a cooling structure for supplying a cooling gas to other surface of the pedestal at an opposite end of the crucible so as to cool the silicon carbide single-crystal substrate through the pedestal; and
- a protrusion provided in the crucible such that the protrusion faces and is tapered outwardly from the one end of the crucible towards the silicon carbide single-crystal substrate,
- wherein one of a temperature of a surface of the seed crystal and a surface of the SIC single crystals grown on the seed crystal is lower than a temperature of the crucible.

7. A manufacturing apparatus for producing silicon carbide single crystals, comprising:
- a crucible for disposing a silicon carbide single-crystal substrate therein as a seed crystal, wherein a mixture gas having a Si included gas and a C included gas is introduced into one end of the crucible, so that silicon carbide single crystals grow on said silicon carbide single-crystal substrate;

a pedestal for fixing the silicon carbide single-crystal substrate at one surface thereof, and being disposed in the crucible;

a cooling structure for supplying a cooling gas to other surface of the pedestal at an opposite end of the crucible so as to cool the silicon carbide single-crystal substrate through the pedestal; and a conduit for supplying the cooling gas to the other surface of the pedestal, wherein
one of a temperature of a surface of the seed crystal and a surface of the SIC single crystals grown on the seed crystal is lower than a temperature of the crucible, and the cooling gas is supplied to the other surface of the pedestal at a flow rate of about 5 liters per minute through the cooling gas conduit.

* * * * *